United States Patent
Toya et al.

(10) Patent No.: US 9,871,157 B2
(45) Date of Patent: Jan. 16, 2018

(54) METHOD FOR PRODUCING CONCENTRATOR PHOTOVOLTAIC UNIT, PRODUCTION APPARATUS USED IN THE METHOD, METHOD FOR PRODUCING CONCENTRATOR PHOTOVOLTAIC MODULE, AND PRODUCTION APPARATUS USED IN THE METHOD

(71) Applicant: Sumitomo Electric Industries, Ltd., Osaka-shi (JP)

(72) Inventors: Kazumasa Toya, Osaka (JP); Takashi Iwasaki, Osaka (JP); Koji Mori, Osaka (JP); Makoto Inagaki, Osaka (JP); Rui Mikami, Osaka (JP); Yoshiki Kuhara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/591,608

(22) Filed: Jan. 7, 2015

(65) Prior Publication Data
US 2015/0194561 A1 Jul. 9, 2015

(30) Foreign Application Priority Data
Jan. 9, 2014 (JP) ................... 2014-002754

(51) Int. Cl.
*H01L 31/054* (2014.01)
*H01L 31/048* (2014.01)
*H02S 40/22* (2014.01)

(52) U.S. Cl.
CPC ........ *H01L 31/0543* (2014.12); *H01L 31/048* (2013.01); *H02S 40/22* (2014.12); *Y02E 10/52* (2013.01)

(58) Field of Classification Search
CPC ... H01L 31/18; H01L 31/054; H01L 31/0543; Y02P 70/521; Y02E 10/52; Y02E 10/50
(Continued)

(56) References Cited
U.S. PATENT DOCUMENTS

| 4,069,812 A | 1/1978 | O'Neill |
| 2007/0295384 A1* | 12/2007 | Uozumi ................... F24J 2/085 136/246 |

(Continued)

FOREIGN PATENT DOCUMENTS

JP 58-138356 U 9/1983

*Primary Examiner* — Georgia Y Epps
*Assistant Examiner* — Don Williams
(74) *Attorney, Agent, or Firm* — Venable LLP; Michael A. Sartori; Laura G. Remus

(57) ABSTRACT

Mutual alignment between a condenser lens and its power generating element can be performed easily and accurately. This method for producing a concentrator photovoltaic unit includes: a first step of emitting linear laser beams respectively toward incident positions 42 on an incident surface 13/1; and a second step of performing positional adjustment between a Fresnel lens 13$f$ and a power generating element part 21, based on positional relationship between the power generating element part 21 and beam images respectively formed by the linear laser beams at a time when the beam images and the power generating element part 21 are seen along an optical axis S from the incident surface 13/1 side of the Fresnel lens 13$f$. Four incident positions 42 in the first step are set such that at least one pair of beam images, among the beam images respectively formed by the linear laser beams, cross each other at an optical axis point S1 of the Fresnel lens 13$f$ when the power generating element part 21 side is seen along the optical axis S from the incident surface 13/1 side of the Fresnel lens 13$f$.

6 Claims, 10 Drawing Sheets

(58) Field of Classification Search
USPC .......... 250/203.4, 204, 208.1, 239; 126/683, 126/684, 698, 699, 700, 704; 136/243, 136/244, 246, 259
See application file for complete search history.

(56) References Cited

U.S. PATENT DOCUMENTS

| | | | |
|---|---|---|---|
| 2008/0129984 A1* | 6/2008 | Cowley | G01M 11/005 |
| | | | 356/124 |
| 2010/0229908 A1* | 9/2010 | Van Steenwyk | H01L 35/30 |
| | | | 136/206 |
| 2010/0236603 A1 | 9/2010 | Menard et al. | |
| 2013/0126706 A1* | 5/2013 | Lynass | G01J 1/42 |
| | | | 250/208.1 |
| 2013/0284260 A1* | 10/2013 | Naito | H01L 31/02244 |
| | | | 136/256 |

* cited by examiner

METHOD FOR PRODUCING CONCENTRATOR PHOTOVOLTAIC UNIT, PRODUCTION APPARATUS USED IN THE METHOD, METHOD FOR PRODUCING CONCENTRATOR PHOTOVOLTAIC MODULE, AND PRODUCTION APPARATUS USED IN THE METHOD

TECHNICAL FIELD

The present invention relates to a method for producing a concentrator photovoltaic unit to be used in a concentrator photovoltaic (CPV) which generates power by concentrating sunlight on a power generating element, a production apparatus used in this method, a method for producing a concentrator photovoltaic module, and a production apparatus used in this method.

BACKGROUND ART

Concentrator photovoltaic is based on a structure in which: a small-sized compound semiconductor element having a high power generation efficiency is used as a power generating element, and sunlight concentrated by a Fresnel lens is caused to be incident on the power generating element (for example, see PATENT LITERATURE 1). A large number of such basic units are arranged in a matrix shape in one housing, thereby to form a concentrator photovoltaic module. A plurality of the modules are further arranged, thereby to form a concentrator photovoltaic panel. By causing this concentrator photovoltaic panel to perform tracking operation so as to always face the sun, it is possible to obtain a desired generated power.

CITATION LIST

Patent Literature

PATENT LITERATURE 1: U.S. Pat. No. 4,069,812

SUMMARY OF INVENTION

Technical Problem

During production of the concentrator photovoltaic module as described above, it is necessary to perform alignment precisely such that, on the optical axis of each condenser lens such as a Fresnel lens, the center of its corresponding power generating element is positioned.

Mutual alignment between power generating elements and condenser lenses can be attained by ensuring their mounting accuracy relative to their common housing, for example. However, only doing this may allow minute individual differences, which may result in misalignment between the optical axis of each condenser lens and the center of its corresponding power generating element. If misalignment occurs, power generation efficiency is reduced.

The present invention has been made in view of such a situation. An object of the present invention is to provide a technology which can realize easy and accurate mutual alignment between each condenser lens and its corresponding power generating element.

Solution to Problem

A method for producing a concentrator photovoltaic unit being one embodiment is a method for producing a concentrator photovoltaic unit, the concentrator photovoltaic unit including a condenser lens configured to concentrate sunlight incident from an incident surface thereof, onto a power generating element part, the method including:

a first step of emitting linear laser beams in parallel to an optical axis of the condenser lens, respectively toward a plurality of specific positions previously set on the incident surface; and a second step of performing positional adjustment between the condenser lens and the power generating element part, based on positional relationship between the power generating element part and beam images respectively formed by the linear laser beams having passed the condenser lens to be concentrated toward a focal point of the condenser lens at a time when the beam images and the power generating element part are seen though the condenser lens along the optical axis from the incident surface side of the condenser lens, wherein the plurality of specific positions in the first step are set to positions that allow at least one pair of beam images, among the beam images at a time when the power generating element part side is seen along the optical axis from the incident surface side of the condenser lens, to be beam images of linear laser beams that cross each other at an optical axis point of the condenser lens.

A method for producing a concentrator photovoltaic module being one embodiment is a method for producing a concentrator photovoltaic module, the concentrator photovoltaic module including: a plurality of power generating element parts provided in a form of an array; and a concentrating member in which a plurality of condenser lenses each concentrating sunlight incident from an incident surface thereof are formed at positions on optical axes thereof and corresponding to the power generating element parts, the method including:

a first step of emitting linear laser beams in parallel to the optical axis of each of at least two of the condenser lenses, respectively toward a plurality of specific positions previously set on the incident surface of the condenser lens; and a second step of performing positional adjustment between the concentrating member and the power generating element parts based on positional relationship, of each of the at least two of the condenser lenses, between beam images respectively formed by the linear laser beams having passed the condenser lens to be concentrated toward a focal point of the condenser lens, and the power generating element part corresponding thereto at a time when the beam images and the corresponding power generating element part are seen though the condenser lens along the optical axis from the incident surface side, wherein the plurality of specific positions in each of the at least two of the condenser lenses in the first step are set to positions that allow at least one pair of beam images, among the beam images at a time when the power generating element part side is seen along the optical axis from the incident surface side of the condenser lens, to be beam images of linear laser beams that cross each other at an optical axis point of the condenser lens.

A production apparatus for a concentrator photovoltaic unit being one embodiment is a production apparatus for a concentrator photovoltaic unit, the concentrator photovoltaic unit including a condenser lens configured to concentrate sunlight incident from an incident surface thereof, onto a power generating element part, the production apparatus including:

a plurality of laser beam sources configured to emit linear laser beams in parallel to an optical axis of the condenser lens, respectively toward a plurality of specific positions previously set on the incident surface;

an image capturing section configured to capture an image of the power generating element part side along the optical axis from the incident surface side of the condenser lens, to output the captured image; and a positional adjustment section configured to perform positional adjustment between the condenser lens and the power generating element part based on positional relationship, grasped through the captured image, between the power generating element part and beam images respectively formed by the linear laser beams having passed the condenser lens to be concentrated toward a focal point of the condenser lens, wherein the plurality of specific positions are set to positions that allow at least one pair of beam images, among the beam images specified in the captured image, to be beam images of linear laser beams that cross each other at an optical axis point of the condenser lens in the captured image.

A production apparatus for a concentrator photovoltaic module being one embodiment is a production apparatus for a concentrator photovoltaic module, the concentrator photovoltaic module including: a plurality of power generating element parts provided in a form of an array; and a concentrating member in which a plurality of condenser lenses each concentrating sunlight incident from an incident surface thereof are formed at positions on optical axes thereof and corresponding to the power generating element parts, the production apparatus including:

a plurality of laser beam sources configured to emit linear laser beams in parallel to the optical axis of each of at least two of the condenser lenses, respectively toward a plurality of specific positions previously set on the incident surface of the condenser lens;

image capturing sections respectively provided at the at least two of the condenser lenses, each image capturing section configured to capture, along the optical axis from the incident surface side of the condenser lens, an image of the power generating element part side corresponding to the condenser lens, and configured to output the captured image; and a positional adjustment section configured to perform positional adjustment between the concentrating member and the power generating element parts based on positional relationship, grasped through the captured image from each image capturing section, between beam images respectively formed by the linear laser beams having passed the condenser lens to be concentrated toward a focal point of the condenser lens, and the power generating element part corresponding thereto, wherein the plurality of specific positions are set to positions that allow at least one pair of beam images, among the beam images specified in the captured image, to be beam images of linear laser beams that cross each other at an optical axis point of the condenser lens in the captured image.

Advantageous Effects of Invention

According to the present invention, mutual alignment between a condenser lens and its corresponding power generating element can be easily and accurately performed.

DESCRIPTION OF EMBODIMENTS

Figure 1:
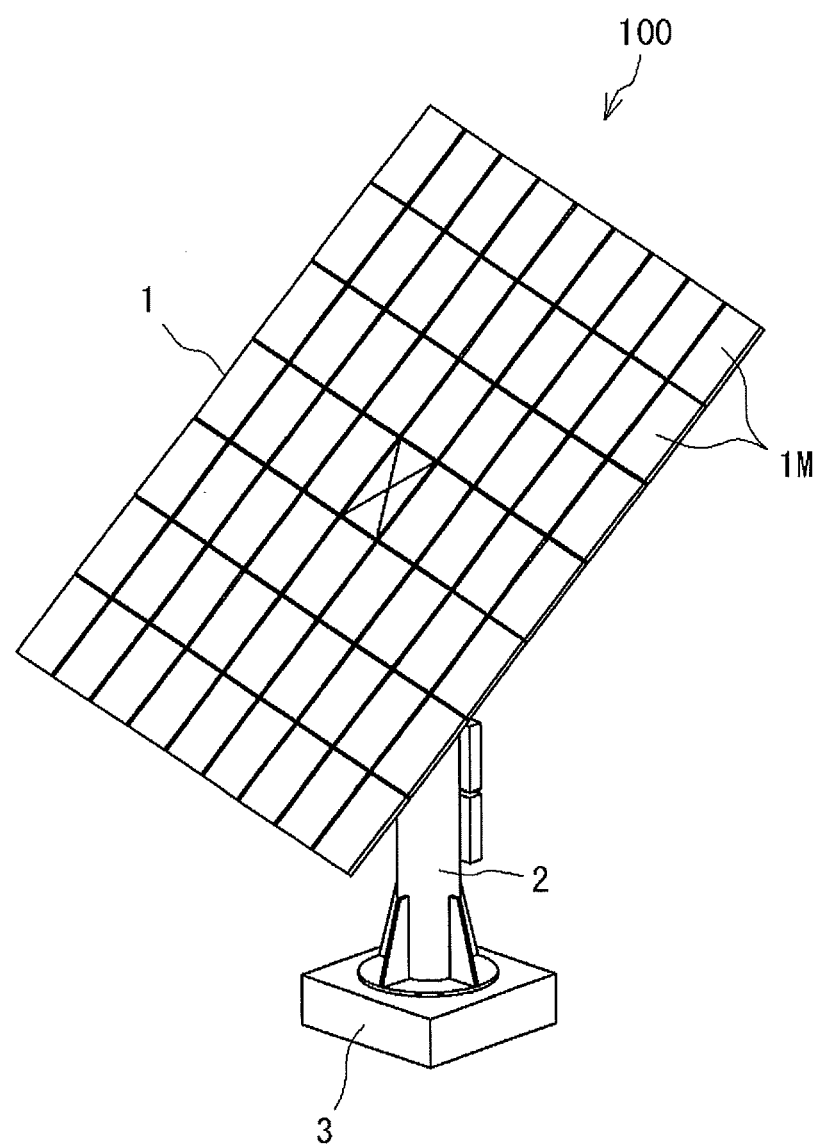
FIG. 1 is a perspective view showing one example of a concentrator photovoltaic apparatus.

Description of Embodiments of the Present Invention

First, contents of embodiments of the present invention will be listed for description.

(1) A method for producing a concentrator photovoltaic unit being one embodiment is a method for producing a concentrator photovoltaic unit, the concentrator photovoltaic unit including a condenser lens configured to concentrate sunlight incident from an incident surface thereof, onto a power generating element part, the method including:

a first step of emitting linear laser beams in parallel to an optical axis of the condenser lens, respectively toward a plurality of specific positions previously set on the incident surface; and a second step of performing positional adjustment between the condenser lens and the power generating element part, based on positional relationship between the power generating element part and beam images respectively formed by the linear laser beams having passed the condenser lens to be concentrated toward a focal point of the condenser lens at a time when the beam images and the power generating element part are seen though the condenser lens along the optical axis from the incident surface side of the condenser lens, wherein the plurality of specific positions in the first step are set to positions that allow at least one pair of beam images, among the beam images at a time when the power generating element part side is seen along the optical axis from the incident surface side of the condenser lens, to be beam images of linear laser beams that cross each other at an optical axis point of the condenser lens.

According to the method for producing the concentrator photovoltaic unit having the above configuration, when the power generating element part side is seen though the condenser lens along the optical axis from the incident surface side of the condenser lens, at least one pair of beam images cross each other at the optical axis point of the condenser lens, and thus, the position of the optical axis of the condenser lens can be recognized.

Thus, in the second step, positional adjustment can be performed based on the positional relationship between the power generating element part and the beam images which allow recognition of the position of the optical axis of the condenser lens at a time when the power generating element part side is seen along the optical axis from the incident surface side of the condenser lens. Thus, alignment between the condenser lens and the power generating element part can be performed easily and accurately.

(2) In the method for producing the concentrator photovoltaic unit above, the power generating element part may include a power generating element, and a secondary condenser lens configured to receive light concentrated by the condenser lens and to lead the light to the power generating element. In this case, based on the positional relationship between the beam images and the secondary condenser lens, alignment between the condenser lens and the power generating element part can be performed.

(3) A method for producing a concentrator photovoltaic module being one embodiment is a method for producing a concentrator photovoltaic module, the concentrator photovoltaic module including: a plurality of power generating element parts provided in a form of an array; and a concentrating member in which a plurality of condenser lenses each concentrating sunlight incident from an incident surface thereof are formed at positions on optical axes thereof and corresponding to the power generating element parts, the method including:

a first step of emitting linear laser beams in parallel to the optical axis of each of at least two of the condenser lenses, respectively toward a plurality of specific positions previously set on the incident surface of the condenser lens; and a second step of performing positional adjustment between the concentrating member and the power generating element parts based on positional relationship, of each of the at least two of the condenser lenses, between beam images respectively formed by the linear laser beams having passed the condenser lens to be concentrated toward a focal point of the condenser lens, and the power generating element part corresponding thereto at a time when the beam images and the corresponding power generating element part are seen though the condenser lens along the optical axis from the incident surface side, wherein the plurality of specific positions in each of the at least two of the condenser lenses in the first step are set to positions that allow at least one pair of beam images, among the beam images at a time when the power generating element part side is seen along the optical axis from the incident surface side of the condenser lens, to be beam images of linear laser beams that cross each other at an optical axis point of the condenser lens.

According to the method for producing the concentrator photovoltaic module having the above configuration, positional adjustment can be performed based on the positional relationship between the power generating element part and the beam images which allow recognition of the position of the optical axis of the condenser lens. Thus, alignment between the concentrating member and the power generating element parts can be performed easily and accurately.

(4) In the method for producing the concentrator photovoltaic module above, preferably, the first step is performed for each of four of the condenser lenses respectively positioned at four corners of the concentrating member having a quadrangular shape, or for each of four of the condenser lenses respectively positioned at edge portions at centers of respective sides of the concentrating member having a quadrangular shape, and positional adjustment between the concentrating member and the power generating element parts is performed through the second step.

In this case, alignment between the optical axes of the condenser lenses and the power generating element parts can be performed by use of the condenser lenses which are distanced from each other, and thus, alignment between the concentrating member and the power generating element parts can be performed more accurately.

(5) A production apparatus for a concentrator photovoltaic unit being one embodiment is a production apparatus for a concentrator photovoltaic unit, the concentrator photovoltaic unit including a condenser lens configured to concentrate sunlight incident from an incident surface thereof, onto a power generating element part, the production apparatus including:

a plurality of laser beam sources configured to emit linear laser beams in parallel to an optical axis of the condenser lens, respectively toward a plurality of specific positions previously set on the incident surface;

an image capturing section configured to capture an image of the power generating element part side along the optical axis from the incident surface side of the condenser lens, to output the captured image; and a positional adjustment section configured to perform positional adjustment between the condenser lens and the power generating element part based on positional relationship, grasped through the captured image, between the power generating element part and beam images respectively formed by the linear laser beams having passed the condenser lens to be concentrated toward a focal point of the condenser lens, wherein the plurality of specific positions are set to positions that allow at least one pair of beam images, among the beam images specified in the captured image, to be beam images of linear laser beams that cross each other at an optical axis point of the condenser lens in the captured image.

According to the production apparatus of the concentrator photovoltaic unit having the above configuration, positional adjustment can be performed based on the positional relationship between the power generating element part and the beam images which allow recognition of the position of the optical axis of the condenser lens, and thus, alignment between the condenser lens and the power generating element part can be easily and accurately performed.

(6) A production apparatus for a concentrator photovoltaic module being one embodiment is a production apparatus for a concentrator photovoltaic module, the concentrator photovoltaic module including: a plurality of power generating element parts provided in a form of an array; and a concentrating member in which a plurality of condenser lenses each concentrating sunlight incident from an incident surface thereof are formed at positions on optical axes thereof and corresponding to the power generating element parts, the production apparatus including:

a plurality of laser beam sources configured to emit linear laser beams in parallel to the optical axis of each of at least two of the condenser lenses, respectively toward a plurality of specific positions previously set on the incident surface of the condenser lens;

image capturing sections respectively provided at the at least two of the condenser lenses, each image capturing section configured to capture, along the optical axis from the incident surface side of the condenser lens, an image of the power generating element part side corresponding to the condenser lens, and configured to output the captured image; and a positional adjustment section configured to perform positional adjustment between the concentrating member and the power generating element parts based on positional relationship, grasped through the captured image from each image capturing section, between beam images respectively formed by the linear laser beams having passed the condenser lens to be concentrated toward a focal point of the condenser lens, and the power generating element part corresponding thereto, wherein the plurality of specific positions are set to positions that allow at least one pair of beam images, among the beam images specified in the captured image, to be beam images of linear laser beams that cross each other at an optical axis point of the condenser lens in the captured image.

According to the production apparatus for the concentrator photovoltaic module having the above configuration, positional adjustment can be performed based on the positional relationship between the power generating element part and the beam images which allow recognition of the position of the optical axis of the condenser lens, and thus, alignment between the concentrating member and the power generating element parts can be performed easily and accurately.

Detailed Description of Embodiments of the Present Invention

Hereinafter, preferable embodiments will be described with reference to the drawings.

[1. Configuration of Concentrator Photovoltaic Module]

FIG. 1 is a perspective view showing one example of a concentrator photovoltaic apparatus. In FIG. 1, a concentrator photovoltaic apparatus 100 includes a concentrator photovoltaic panel 1, a post 2 which supports the concentrator photovoltaic panel 1 on the rear surface side thereof, and a base 3 on which the post 2 is mounted.

The concentrator photovoltaic panel 1 is formed by assembling a large number of concentrator photovoltaic modules 1M vertically and horizontally. In this example, 62 (7 in length×9 in breadth−1) concentrator photovoltaic modules 1M are assembled vertically and horizontally, except the center portion. When one concentrator photovoltaic module 1M has a rated output of, for example, about 100 W, the entirety of the concentrator photovoltaic panel 1 has a rated output of about 6 kW.

On the rear surface side of the concentrator photovoltaic panel 1, a driving device (not shown) is provided. By operating this driving device, it is possible to cause the concentrator photovoltaic panel 1 to always face the direction of the sun.

Figure 2:
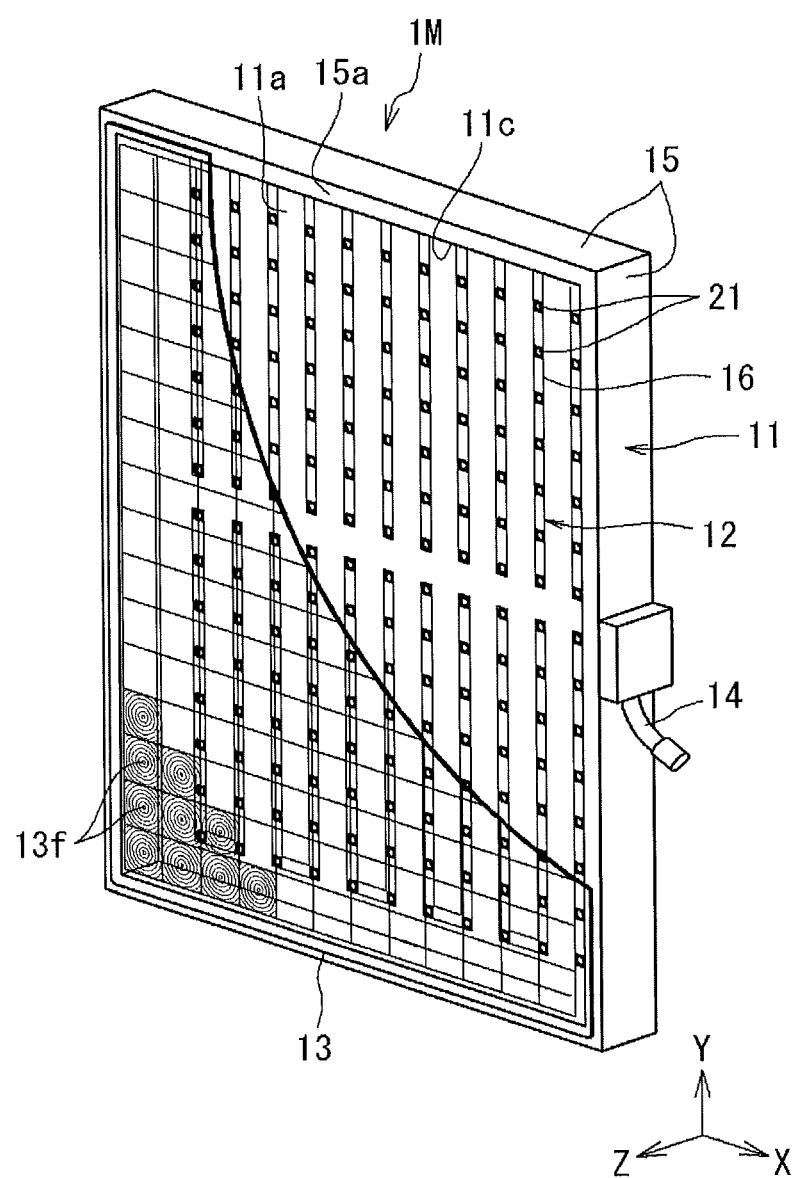
FIG. 2 is a perspective view (partially cut out) showing an enlarged view of one example of a concentrator photovoltaic module.

FIG. 2 is a perspective view (partially cut out) showing an enlarged view of one example of the concentrator photovoltaic module (hereinafter, also simply referred to as "module") 1M. Three directions orthogonal with one another are defined as X, Y, and Z, as shown in FIG. 2.

In FIG. 2, the module 1M includes: a housing 11 formed in a vessel shape and having a bottom surface 11a in parallel to the X-Y plane; a plurality of flexible printed circuits 12 provided on the bottom surface 11a; and a lens panel 13 (concentrating member) having a rectangular shape (shown in a state of being partially cut out), mounted on an end surface 15a of a wall part 15 standing from the periphery of the bottom surface 11a, and closing an opening 11c of the housing 11. The housing 11 is made of metal, for example, and an aluminium alloy which is excellent in thermal conductivity in particular is suitable therefor.

The lens panel 13 is a Fresnel lens array and is formed by arranging, in a matrix shape, a plurality of (for example, 16 in length×12 in breadth, 192 in total) Fresnel lenses 13f as lens elements which concentrate sunlight. Each Fresnel lens 13f forms a square effective concentration region. The lens panel 13 can be obtained by, for example, forming a silicone resin film on a back surface (inside) of a glass plate used as a base material. Each Fresnel lens 13f is formed on this silicone resin film. On the external surface of the housing 11, a connector 14 for taking out an output from the module 1M is provided.

Each flexible printed circuit 12 includes: a flexible substrate 16, of a ribbon shape, on which a necessary conduction pattern is provided; and a plurality of power generating element parts 21 provided on this flexible substrate 16. In the example shown in FIG. 2, each flexible printed circuit 12 has eight power generating element parts 21 mounted thereon. The flexible printed circuits 12 are arranged in a plurality of rows along the longitudinal direction of the housing 11, and 24 flexible printed circuits 12 are arranged in total. Thus, the total number of the power generating element parts 21 is 192 (24×8). That is, the number of the power generating element parts 21 is the same as the number of the Fresnel lenses 13f of the lens panel 13, and further, the power generating element parts 21 are provided on the optical axes of their corresponding Fresnel lenses 13f, respectively.

A Fresnel lens 13f and a power generating element part 21 provided so as to correspond to each other form a concentrator photovoltaic unit as an optical system basic unit for constructing the module 1M described above.

Figure 3:
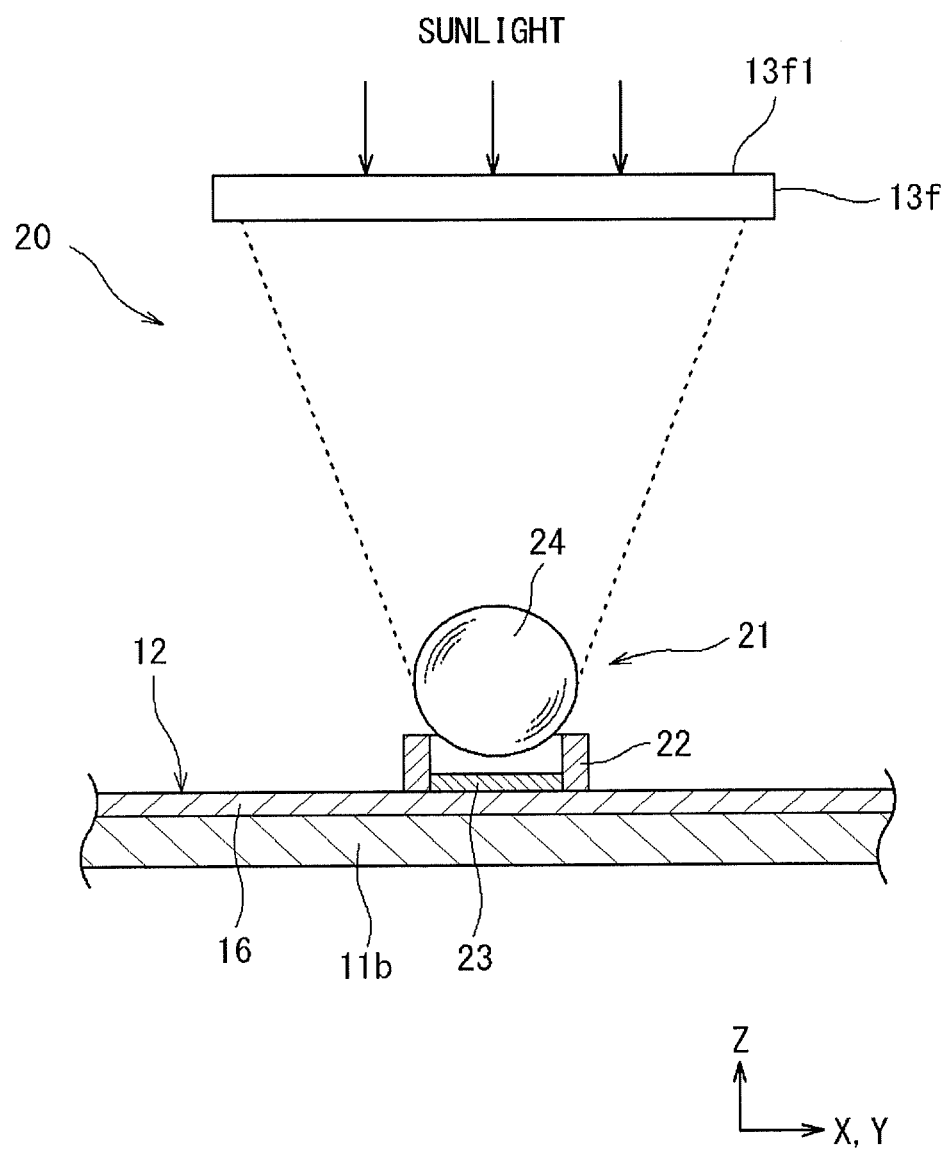
FIG. 3 is a schematic diagram showing a concentrator photovoltaic unit.

FIG. 3 is a schematic diagram showing the concentrator photovoltaic unit.

In FIG. 3, a photovoltaic unit (hereinafter, also simply referred to as "unit") 20 includes the Fresnel lens 13f and the power generating element part 21 described above.

The Fresnel lens 13f concentrates sunlight incident from an incident surface 13f1, onto the power generating element part 21 provided so as to correspond thereto.

The power generating element part 21 includes: a ball lens 24; and a solar cell 23 as a power generating element, the solar cell being 23 packaged by a resin frame 22 surrounding the periphery thereof on the flexible substrate 16.

The ball lens 24 is a spherical lens formed by use of borosilicate-based glass or quartz-based glass, for example. The ball lens 24 is fixed to the resin frame 22 by adhesive bonding using a silicone resin, an acrylic resin, or the like. Accordingly, the ball lens 24 is fixed to the solar cell 23, with a slight gap therebetween. This gap may be filled with the silicone resin, the acrylic resin, or the like described above.

The ball lens 24 is provided so as to receive sunlight concentrated by the Fresnel lens 13f, to lead the sunlight to the solar cell 23. That is, the Fresnel lens 13f serves as a primary condenser lens, and the ball lens 24 serves as a secondary condenser lens.

In this configuration, sunlight is concentrated by the Fresnel lens 13f being the primary condenser lens, then further concentrated by the ball lens 24 being the secondary condenser lens, and then emitted on the solar cell 23. Therefore, a large amount of light energy is concentrated on the solar cell 23, and thus, power can be generated at high efficiency.

The module 1M is configured to include a plurality of units 20 which each can generate power at high efficiency as described above, and outputs power generated by each unit 20 from the connector 14.

[2. Method for Producing Concentrator Photovoltaic Module]

Next, of the method for producing the module 1M, a method for mounting the lens panel 13 of the module 1M onto the housing 11 will be described in particular.

As described above, each power generating element part 21 is provided on the optical axis of its corresponding Fresnel lens 13f. If the power generating element part 21 is greatly misaligned from the optical axis of the Fresnel lens 13f, power generation efficiency is reduced.

Therefore, when the lens panel 13 is to be fixed on the housing 11, it is necessary to perform positional adjustment such that the optical axis of each Fresnel lens 13f of the lens panel 13 is accurately aligned with its corresponding power generating element part 21 provided in the housing 11.

[2.1 Mounting Device]

Figure 4:
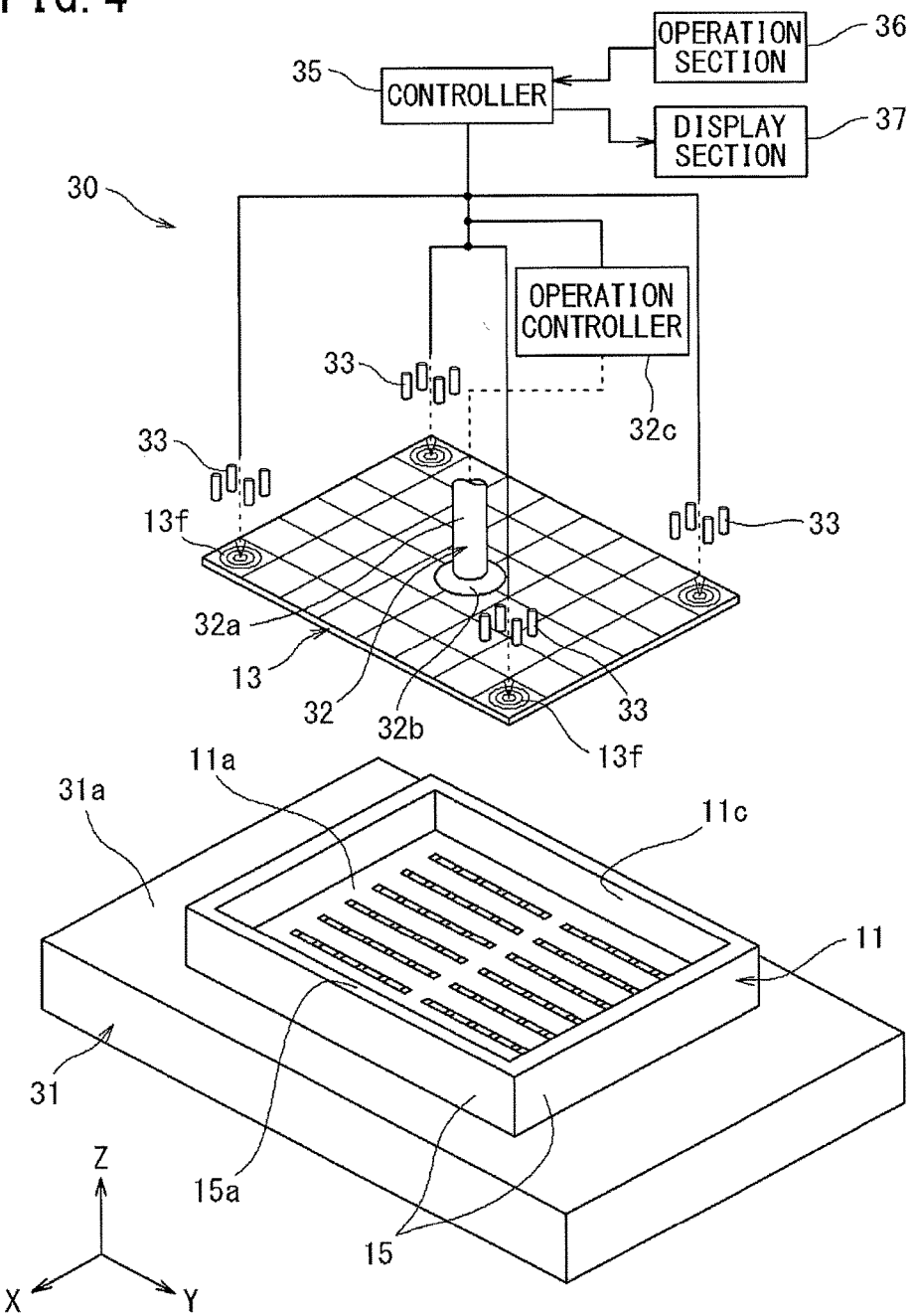
FIG. 4 schematically shows one example of a mounting device for mounting a lens panel of the module onto a housing.

FIG. 4 schematically shows one example of a mounting device for mounting the lens panel 13 of the module 1M onto the housing 11. In FIG. 4, three directions orthogonal with one another are defined as X, Y, and Z, as shown in FIG. 4.

This mounting device 30 includes a base 31, a manipulator 32 for moving the lens panel 13, and position specifying devices 33.

The mounting device 30 further includes: a controller 35 for controlling the manipulator 32 and the position specifying devices 33; an operation section 36 for receiving an operation input made by an operator of the mounting device 30; and a display section 37 for displaying images captured by the position specifying devices 33 at the time of positional adjustment as described later.

The base 31 is for fixing the housing 11. The base 31 fixes the housing 11 whose opening 11c faces upward (Z direction), on an upper surface 31a. The base 31 fixes the housing 11 such that the bottom surface 11a of the housing 11 becomes horizontal (parallel to the X-Y plane).

The manipulator 32 includes an arm part 32a, a suction cup part 32b at the leading end of the arm part 32a, and an operation controller 32c which controls operations of these.

The suction cup part 32b, being a vacuum suction cup, strongly adheres to the surface of the lens panel 13, and thus can hold the lens panel 13.

The arm part 32a is the arm leading end of a six-axis vertical articulated robot, for example, and can raise and lower the lens panel 13 in the Z direction while maintaining the lens panel 13 in a horizontal state along the X-Y plane. The atm part 32a can arbitrarily move the lens panel 13 in X-Y directions while maintaining the lens panel 13 in a horizontal state along the X-Y plane. Further, the arm part 32a can also rotate the lens panel 13 about the central axis of the arm part 32a.

Thus, the manipulator 32 can move the lens panel 13 to above the housing 11 fixed on the base 31 and place the lens panel 13 onto the end surface 15a of the wall part 15 of the housing 11. Further, the manipulator 32 can horizontally move the lens panel 13 placed on the end surface 15a to adjust the position of the lens panel 13 relative to the housing 11 (the power generating element parts 21).

Operations of the arm part 32a and the suction cup part 32b are controlled by the operation controller 32c. The operation controller 32c controls operations of the arm part 32a and the suction cup part 32b based on instruction from the controller 35.

The position specifying devices 33 are respectively arranged at predetermined positions above the Fresnel lenses 13f respectively positioned at four corners of the lens panel 13. Each position specifying device 33 is fixed relative to the lens panel 13, so as not to be displaced relatively from the lens panel 13. The position specifying device 33 may not be fixed to the lens panel 13 as long as the position specifying device 33 is fixed so as not to be displaced relatively from the lens panel 13. For example, the position specifying device 33 may be fixed to a part of the manipulator 32 via a frame or the like.

In this manner, each position specifying device 33 is fixed so as not to be displaced relatively from the lens panel 13 even when the lens panel 13 is moved by the manipulator 32, and thus, the position specifying device 33 is always at the same position relative to the lens panel 13.

Each position specifying device 33 includes a plurality of laser beam source parts and a camera part, and has a function of emitting laser beams toward the Fresnel lens 13f and capturing an image of the power generating element part 21 side through the Fresnel lens 13f. Details thereof will be described later.

The controller 35 has a function of comprehensively controlling each position specifying device 33 and the manipulator 32 based on an operation input made by the operator and received by the operation section 36. The controller 35 aggregates data of images captured by the position specifying devices 33, to provide the data to the display section 37.

The operation section 36 is formed by an input device such as operation keys or the like, and provides instruction based on an operation input made by the operator, to the controller 35.

The display section 37 has a function of visually displaying the data of captured images provided by the controller 35, and is formed by an output device such as a liquid crystal display, a touch panel, or the like. In a case where the display section 37 is formed by a touch panel, the display section 37 can be configured to also have the function of the operation section 36.

The operator can input necessary information to the operation section 36 while confirming information displayed on the display section 37, operate the mounting device 30 while confirming the current state on the display section 37, and perform mounting of the lens panel 13, including positional adjustment and the like of the lens panel 13 described later.

Next, a method for mounting the lens panel 13 of the module 1M onto the housing 11 by use of the mounting device 30 will be described.

[2.2 Mounting Method]

First, as shown in FIG. 4, the housing 11 is fixed onto the upper surface 31a of the base 31.

Next, the manipulator 32 is caused to hold the lens panel 13 so as to be horizontal (parallel to the X-Y plane), and then is caused to move the lens panel 13 to above the housing 11.

Then, the lens panel 13 is lowered to a position (a position in the Z direction) where the height dimension between the lens panel 13 and the power generating element parts 21 on the bottom surface 11a becomes a predetermined value set based on the focal length of the lens panel 13 (the Fresnel lens 13f).

Figure 5:
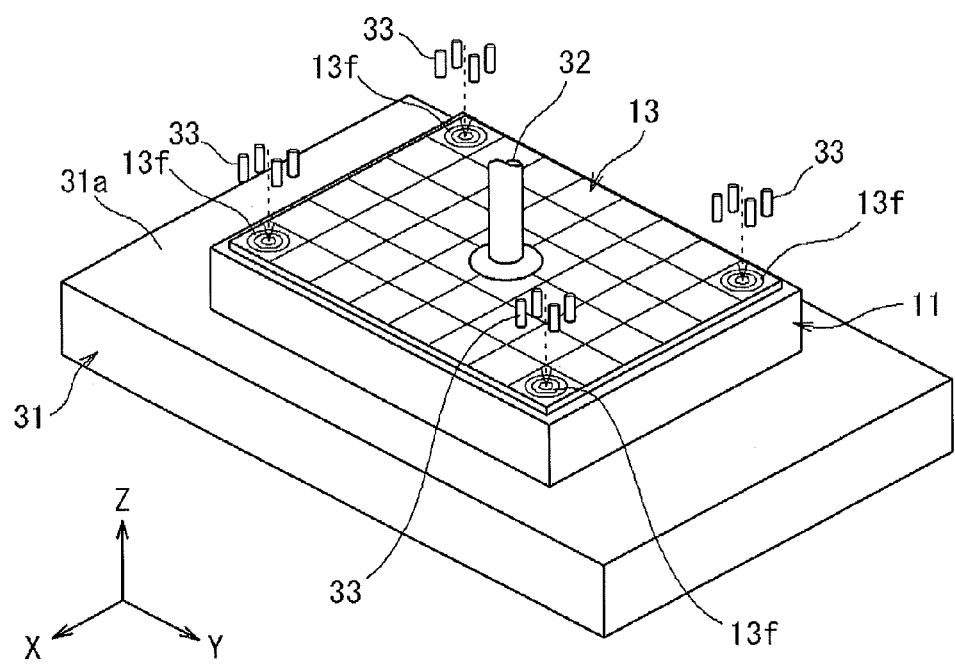
FIG. 5 shows a state where the lens panel has been lowered by the mounting device.

FIG. 5 shows a state where the lens panel 13 has been lowered by the mounting device 30. As shown in FIG. 5, the lens panel 13 has been lowered and is held by the manipulator 32 at the position where the height dimension between the lens panel 13 and the power generating element parts 21 on the bottom surface 11a is a predetermined value as described above.

With respect to horizontal (the X-Y plane) directions, the lens panel 13 is roughly positioned based on the shape of the opening 11c of the housing 11, and is held at a position where the lens panel 13 closes the opening 11c of the housing 11.

At this time, the lens panel 13 is being held by the manipulator 32. Thus, the manipulator 32 can move the lens panel 13 in a horizontal direction and in a rotation direction about the central axis of the arm part 32a, while maintaining the horizontal state of the lens panel 13.

Next, the position specifying devices 33 are disposed and fixed at predetermined positions above the Fresnel lenses 13f which are positioned at the four corners of the lens panel 13.

Figure 6:
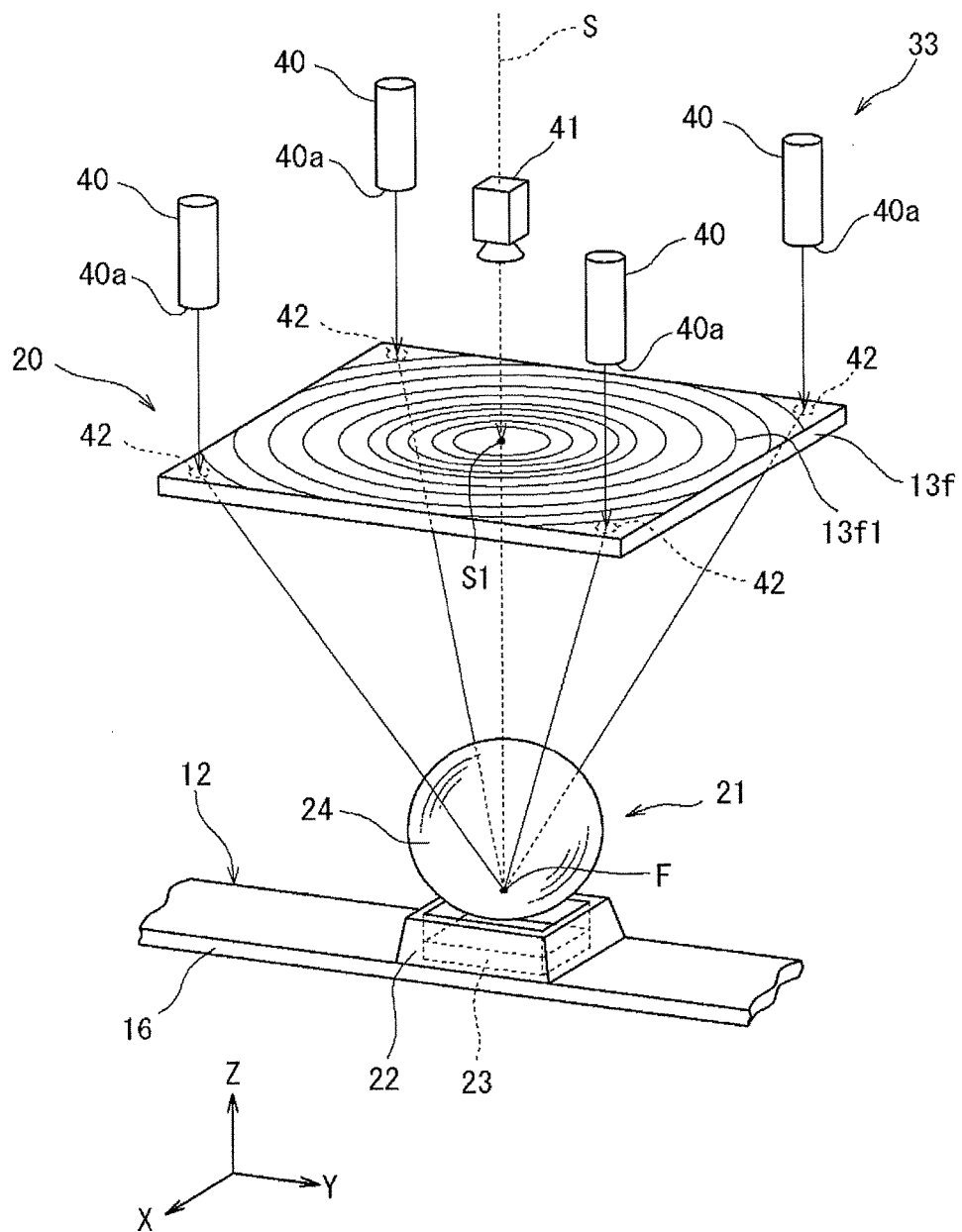
FIG. 6 schematically shows a configuration of a position specifying device disposed above a Fresnel lens.

FIG. 6 schematically shows a configuration of the position specifying device 33 disposed above the Fresnel lens 13f.

In FIG. 6, the position specifying device 33 includes a plurality (four in the example shown) of laser beam source parts 40 and one camera part 41.

The camera part 41 includes an image capturing device, such as: a lens for concentrating light; a CCD (Charge Coupled Device) for converting the light concentrated by the lens into an electric signal; a CMOS (Complementary Metal-Oxide Semiconductor); and the like. The camera part 41 is configured to capture an image of a predetermined imaging range to generate captured image data, and to continuously provide the captured image data to the controller 35 at a predetermined time interval.

The camera part 41 is disposed such that the imaging direction in which the camera part 41 captures an image of the imaging range is parallel to an optical axis S of the Fresnel lens 13f and such that the center of the imaging range is at the optical axis point S1 on the incident surface 13f1 of the Fresnel lens 13f. That is, the camera part 41 is disposed such that the imaging direction thereof is aligned with the optical axis S of the Fresnel lens 13f. Since the Fresnel lens 13f is held in a horizontal state, the optical axis S is parallel with the Z-axis direction.

Accordingly, the camera part 41 is configured to capture an image of the power generating element part 21 side along the optical axis S of the Fresnel lens 13f from the incident surface 13f1 side of the Fresnel lens 13f.

Each laser beam source part 40 includes a semiconductor laser device for emitting a laser beam of a predetermined wavelength, a collimating lens for collimating this laser beam, and the like, and emits collimated linear laser beam from an emission portion 40a from which laser beam is emitted.

The four laser beam source parts 40 are arranged at the four corners of the Fresnel lens 13E The laser beam source parts 40 are arranged so as to emit linear laser beams in parallel to the optical axis S (parallel to the Z-axis direction) respectively toward the incident positions 42 at the four corners previously set on the incident surface 13f1

Since the Fresnel lens 13f concentrates incident light toward the focal point F of the Fresnel lens 13f, the linear laser beams emitted by the respective laser beam source parts 40 and incident on the respective incident positions 42 on the incident surface 13f1 still advance as linear laser beams also after passing the Fresnel lens 13f, to be concentrated toward the focal point F.

Figure 7A:
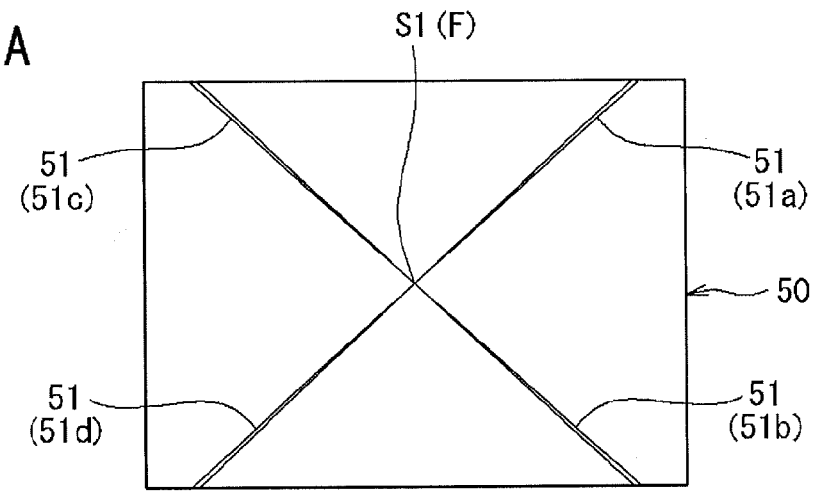
FIG. 7A shows captured images obtained by a camera part when each laser beam source part has emitted a linear laser beam, and shows one example of a captured image when nothing is present on the optical axis of the Fresnel lens.

FIG. 7A shows captured images obtained by the camera part 41 when each laser beam source part 40 has emitted a linear laser beam, and shows one example of a captured image when nothing is present on the optical axis S of the Fresnel lens 13f.

Linear laser beams emitted toward the respective incident positions 42 at the four corners of the incident surface 13f1 of the Fresnel lens 13f are concentrated by the Fresnel lens 13f toward the focal point F (FIG. 6) of the Fresnel lens 13f.

At this time, each linear laser beam to be concentrated forms a linear beam image along the optical path of the linear laser beam.

Thus, as shown in FIG. 7A, in a captured image 50 obtained by the camera part 41, there appear four captured portions 51 of beam images, in which the linear beam images respectively formed by the linear laser beams emitted from the portions corresponding to the incident positions 42 are captured.

Since the linear laser beams are concentrated toward the focal point F, the captured portions 51 of beam images also extend toward the focal point F. Thus, the portion where the captured portions 51 of beam images cross each other at the center of the captured image 50 indicates the focal point F.

Here, the camera part 41 is disposed such that the imaging direction when the camera part 41 captures an image of the imaging range is parallel to the optical axis S of the Fresnel lens 13f and such that the center of the imaging range is at the optical axis point S1 on the incident surface 13f1 of the Fresnel lens 13f. Therefore, the captured image 50 is an image, captured along the optical axis S, of the portion around the focal point F where the respective beam images are concentrated. That is, the portion where the captured portions 51 of beam images cross each other in the captured image 50 is the optical axis point S1, and indicates the position on the X-Y plane of the focal point F.

Therefore, from the captured portions 51 of beam images on the captured image 50, it is possible to recognize the position of the optical axis of the Fresnel lens 13f on the horizontal plane (on the X-Y plane).

In the present embodiment, the incident positions 42 are respectively set at the four corners of the incident surface 13f1, and thus, among the captured portions 51 of the beam images specified in the captured image 50 obtained by the camera part 41, at least one pair of captured portions 51 of beam images cross each other at the optical axis point S1. For example, a captured portion 51a of first beam image crosses a captured portion 51b of second beam image and a captured portion 51c of third beam image. The captured portion 51b of second beam image crosses the captured portion 51a of first beam image and a captured portion 51d of fourth beam image.

By use of the captured image 50 which allows recognition of the optical axis of the Fresnel lens 13f as described above, the optical axis of the Fresnel lens 13f can be accurately aligned with its corresponding power generating element part 21.

Now, the camera part 41 and the laser beam source parts 40, both constituting the position specifying device 33, are arranged and fixed at predetermined positions above the Fresnel lenses 13f which are positioned at the four corners of the lens panel 13, and then, the laser beam source parts 40 are respectively caused to emit linear laser beams in parallel to the optical axis S (first step).

Here, the position in the Z direction (the height dimension between the lens panel 13 and the power generating element parts 21) of the lens panel 13 (the Fresnel lenses 13*f*) is set based on the focal length of the lens panel 13 (the Fresnel lenses 13*f*) as described above.

In addition, the position on the X-Y plane of the lens panel 13 has been roughly determined. Accordingly, near the focal point of each Fresnel lens 13*f*, its corresponding power generating element part 21 is present.

In this state, when the laser beam source parts 40 are respectively caused to emit linear laser beams, the linear laser beams are concentrated on the focal point F of the Fresnel lens 13*f* as shown in FIG. 6, thereby being concentrated toward the power generating element part 21 which is present near the focal point F.

At this time, each camera part 41 can capture an image of the power generating element part 21 and beam images respectively formed by the linear laser beams being concentrated toward the power generating element part 21.

Thus, next, each camera part 41 is caused to output the captured image 50 of the power generating element part 21 and the beam images respectively formed by the linear laser beams; and then, the lens panel 13 is moved on the X-Y plane, based on the positional relationship between the captured portions 51 of the beam images and the captured portion of the corresponding power generating element part 21 in the captured image 50 obtained by the camera part 41, whereby positional adjustment between the lens panel 13 and the power generating element part 21 is performed (second step).

Figure 7B:
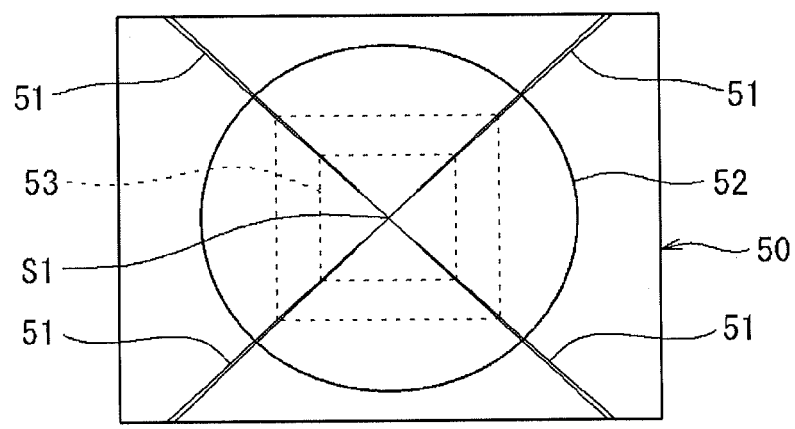
FIG. 7B shows captured images obtained by a camera part when each laser beam source part has emitted a linear laser beam, and shows one example of a captured image when a power generating element part is present near the focal point of the Fresnel lens.

In FIG. 7B shows one example of a captured image when the power generating element part 21 is present near the focal point of the Fresnel lens 13*f*, and shows a case where the optical axis S of the Fresnel lens 13*f* is substantially aligned with the center of the power generating element part 21.

In this case, the linear laser beams pass the ball lens 24 of the power generating element part 21, to be concentrated on the focal point near the center of the solar cell 23.

The captured image 50 shows a state where the captured portions 51 of the beam images having passed a captured portion 52 of the ball lens 24 are gathering, while keeping their linear shapes, at one point near the centers of the captured portion 52 of the ball lens 24 and a captured portion 53 of the solar cell 23.

The point where the captured portions 51 of the beam images are gathering is the optical axis point S1, and indicates the position on the X-Y plane of the focal point of the Fresnel lens 13*f*.

Thus, in the case of FIG. 7B, it is possible to determine that the optical axis of the Fresnel lens 13*f* is located near the centers of the ball lens 24 and the solar cell 23.

Figure 7C:
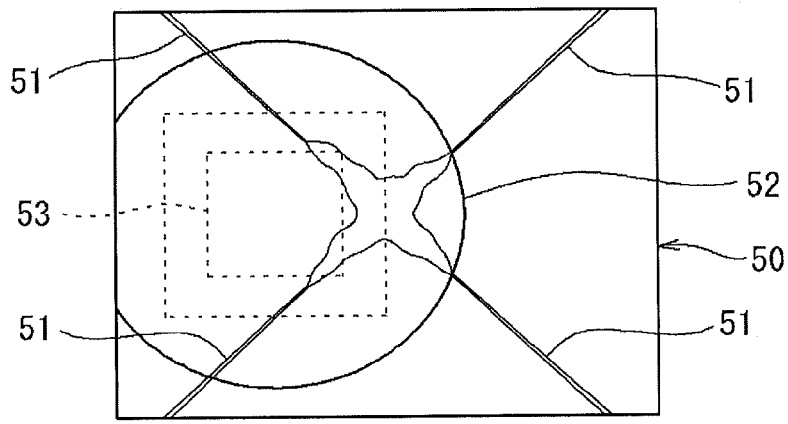
FIG. 7C shows captured images obtained by a camera part when each laser beam source part has emitted a linear laser beam, and shows the other example of a captured image when the power generating element part is present near the focal point of the Fresnel lens.

FIG. 7C shows the other example of a captured image when the power generating element part 21 is present near the focal point of the Fresnel lens 13*f*, and shows a case where the optical axis S of the Fresnel lens 13*f* is not aligned with the center of the power generating element part 21.

In such a case, the linear laser beams are not concentrated on the focal point near the center of the solar cell 23, and in addition, in some cases, do not pass the ball lens 24 of the power generating element part 21, or are incident on the ball lens 24 from unexpected positions, whereby distortion occurs in the beam images.

Accordingly, in the captured image 50, the captured portions 51 of the beam images appear in a distorted manner.

That is, as shown in FIG. 7C, when the captured portions 51 of the beam images appear in a distorted manner, it is possible to determine that the optical axis of the Fresnel lens 13*f* is not located near the centers of the ball lens 24 and the solar cell 23.

The lens panel 13 is moved on the X-Y plane such that the captured images 50 outputted by (the camera parts 41 of) the position specifying devices 33 respectively arranged at the four corners of the lens panel 13 are each in the state as shown in FIG. 7B as much as possible.

Figure 8:
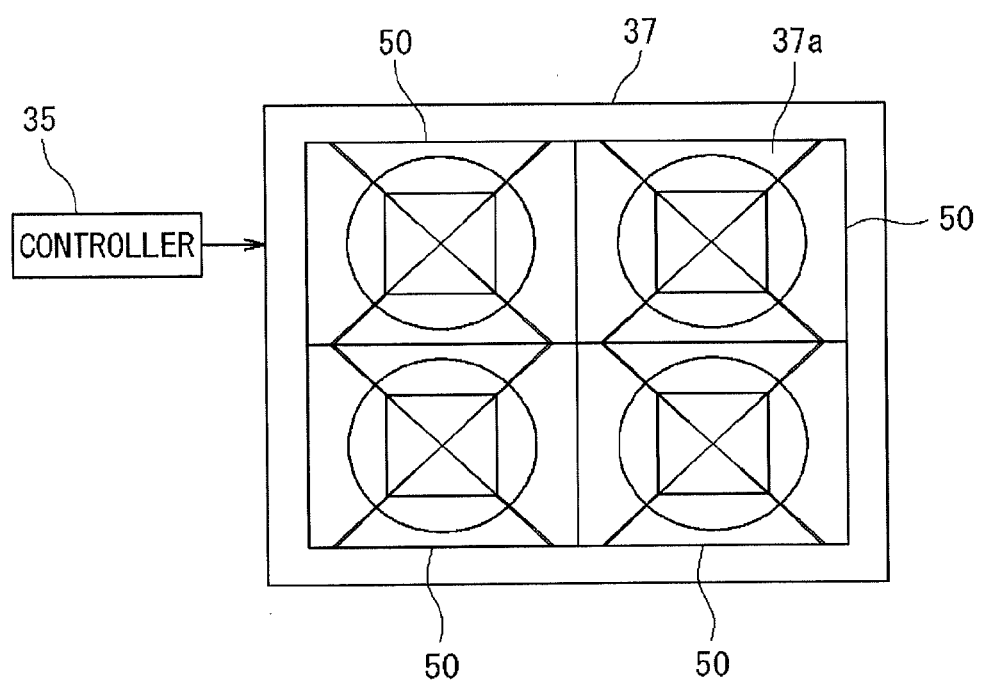
FIG. 8 shows one example of an aspect where captured images respectively outputted by the position specifying devices are displayed on a display section.

FIG. 8 shows one example of an aspect where the captured images 50 respectively outputted by the position specifying devices 33 are displayed on the display section 37.

The controller 35 controls the display section 37 such that four captured images 50 respectively provided from the position specifying devices 33 are arranged side by side so as to be respectively displayed in four divided portions of a display screen 37*a* of the display section 37.

The operator can grasp the positional relationship between the beam images of the respective linear laser beams and the power generating element part 21 by viewing each captured image 50 being an image at the time when the power generating element part 21 side is seen along the optical axis S from the incident surface 13*f*1 side of the Fresnel lens 13*f*. Based on this positional relationship, the operator can perform positional adjustment between the lens panel 13 (the Fresnel lenses 13*f*) and the corresponding power generating element parts 21.

In this case, by displaying the captured images 50 arranged side by side, it is easy for the operator to grasp the position of the lens panel 13 in the current state, and also easy for the operator to perform operation of positional adjustment for moving the lens panel 13 to an appropriate position.

Based on the respective four captured images 50, when the lens panel 13 has been adjusted to a position which allows determination that the optical axes of the four Fresnel lenses 13*f* have been aligned with their corresponding power generating element parts 21 in an allowable range, the lens panel 13 is temporarily fixed to the end surface 15*a* of the wall part 15 of the housing 11 with an adhesive or the like.

Then, the housing 11 is sent to the next step, and in the next step, the lens panel 13 is fixed to the housing 11 with a resin for fixation.

Based on the respective four captured images 50, by adjusting the optical axes of the four Fresnel lenses 13*f* so as to be aligned with their corresponding power generating element parts 21 in an allowable range, it is possible to attain accurate alignment at least with respect to the positional relationship between the optical axes of the Fresnel lenses 13*f*, at the four corners of the lens panel 13, for which the position specifying devices 33 have been set, and their corresponding power generating element parts 21.

When the positions of the four Fresnel lenses 13*f* are determined, the position of the lens panel 13 relative to the housing 11 is also determined. Thus, also with respect to the positional relationship between the other Fresnel lenses 13*f* for which the position specifying devices 33 are not set and their corresponding power generating element parts 21, it is possible to consider that the other Fresnel lenses 13*f* are aligned with their corresponding power generating element parts 21 in the range of the accuracy of the Fresnel lenses 13*f* formed in the lens panel 13 and the arrangement accuracy of the power generating element parts 21 disposed in the housing 11.

As described above, according to the mounting method of the present embodiment, it is possible to perform positional adjustment such that the optical axis of each Fresnel lens 13*f* of the lens panel 13 is accurately aligned with its corresponding power generating element part 21 provided in the housing 11.

In the above embodiment, a case has been described in which the controller 35 displays the captured images 50 on the display section 37. However, when the controller 35 has a function of performing image processing on each captured image 50 and generating positional information indicating the positional relationship between the beam images of the linear laser beams and the power generating element part 21, the controller 35 may be configured to output and display this positional information on the display section 37. In this case, based on the above positional information, the operator can easily grasp the position of the lens panel 13 and also easily perform operation of positional adjustment for moving the lens panel 13 to an appropriate position.

[3. Effects]

The present embodiment is a method for producing the module 1M, the module 1M including a large number of units 20 each including the Fresnel lens 13f, the Fresnel lens 13f configured to concentrate sunlight incident from the incident surface 13f1 thereof, onto the power generating element part 21, the method including: a first step of emitting linear laser beams in parallel to the optical axis S of each of target Fresnel lenses 13f, respectively toward four incident positions 42 previously set on the incident surface 13f1 thereof; and a second step of performing positional adjustment between the lens panel 13 (Fresnel lenses 13f) and the power generating element part 21, based on the positional relationship between the power generating element part 21 and beam images respectively formed by the linear laser beams having passed the Fresnel lens 13f to be concentrated toward the focal point F of the Fresnel lens 13f at a time when the beam images and the power generating element part 21 are seen along the optical axis S from the incident surface 13f1 side of the Fresnel lens 13f, wherein the four incident positions 42 in the first step are set to positions that allow at least one pair of beam images, among the beam images at a time when the power generating element part 21 side is seen along the optical axis S from the incident surface 13f1 side of the Fresnel lens 13f, to be beam images of linear laser beams that cross each other at the optical axis point S1 of the Fresnel lens 13f.

According to the above configuration, when the power generating element part 21 side is seen though the captured image 50 along the optical axis S from the incident surface 13f1 side of the Fresnel lens 13f, beam images respectively formed by the linear laser beams cross each other at the optical axis point S1 of the Fresnel lens 13f. Thus, the position of the optical axis S of the Fresnel lens 13f can be recognized.

Thus, when performing positional adjustment (second step) between the lens panel 13 and the power generating element part 21 by moving the lens panel 13 on the X-Y plane, it is possible to perform positional adjustment based on the positional relationship between the power generating element part 21 and the beam images which allow recognition of the position of the optical axis S at a time when the power generating element part 21 side is seen though the captured image 50 along the optical axis S from the incident surface 13f1 side of the Fresnel lens 13f. Thus, it is possible to easily and accurately perform alignment between the Fresnel lens 13f and the power generating element part 21.

In the present embodiment, each power generating element part 21 includes the solar cell 23 as a power generating element and the ball lens 24 as a secondary condenser lens. In this case, even if the state where the captured portions 51 of the beam images cross each other as shown in FIG. 7B is not clearly confirmed, alignment between the Fresnel lens 13f and the power generating element part 21 can be performed based on the positional relationship between (the captured portions 51 of) the beam images and (the captured portion 52 of) the ball lens 24.

Also in a case of using a power generating element part not including the ball lens 24 as in the power generating element part 21 of the present embodiment, it is possible to grasp the positional relationship between the beam images and the power generating element part by use of the captured image 50, and it is possible to perform alignment between the Fresnel lens 13f and the power generating element part 21 based on this positional relationship.

[4. Modifications]

In the present embodiment, a case has been shown in which the position specifying devices 33 are respectively arranged for the four Fresnel lens 13f respectively positioned at the four corners of the rectangular lens panel 13. However, if the position specifying devices 33 are respectively arranged for at least two Fresnel lenses 13f, and at each position specifying device 33, alignment is performed between the optical axis S of the Fresnel lens 13f and the power generating element part 21, the position of the lens panel 13 can be specified on the horizontal plane (the X-Y plane). Thus, when mounting the lens panel 13 onto the module 1M, it is sufficient that the position specifying devices 33 are respectively arranged for at least two Fresnel lenses 13f.

However, the greater the number of positions where the alignment is performed for the lens panel 13, the higher the accuracy of the alignment becomes. In addition, the greater the distance between the positions at which the alignment is performed, the higher the accuracy of the alignment becomes.

In this point, in the present embodiment, the position specifying devices 33 are respectively arranged for the four Fresnel lenses 13f respectively positioned at the four corners of the rectangular lens panel 13, and positional adjustment between the lens panel 13 and the power generating element parts 21 is performed. Thus, alignment between the optical axes S of the Fresnel lenses 13F and the power generating element parts 21 can be performed by use of the Fresnel lenses 13f which are distanced from each other on the lens panel 13, and thus, alignment between the lens panel 13 and the power generating element parts 21 can be performed more accurately.

Figure 9A:
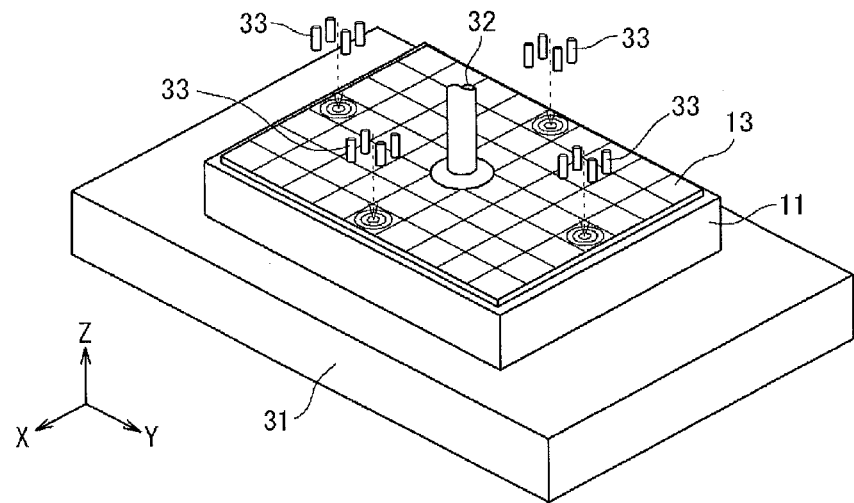
FIG. 9A shows another arrangement example of the position specifying devices.

As shown in FIG. 9A, the position specifying devices 33 may be respectively arranged for four Fresnel lenses 13f positioned at edge portions at the centers of the respective sides of the rectangular lens panel 13.

Also in this case, alignment between the optical axes S of the Fresnel lenses 13f and the power generating element parts 21 can be performed by use of the Fresnel lenses 13f which are distanced from each other on the lens panel 13, whereby alignment between the lens panel 13 and the power generating element parts 21 can be performed more accurately.

Figure 9B:
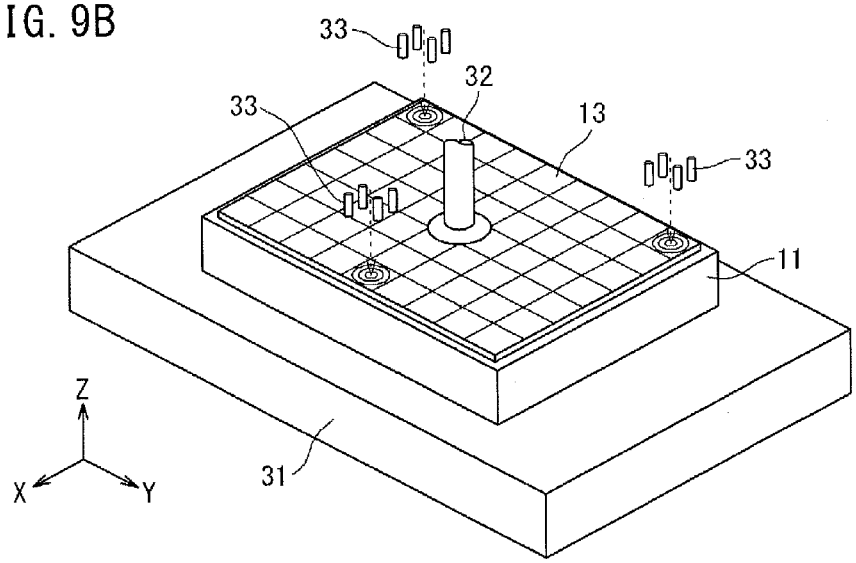
FIG. 9B shows the other arrangement example of the position specifying devices.

Further, as shown in FIG. 9B, a configuration may be employed in which the position specifying devices 33 are respectively arranged for the Fresnel lenses 13f respectively positioned at both ends of one of the long sides of the rectangular lens panel 13, and the position specifying device 33 is arranged for the Fresnel lens 13f positioned at an edge portion at the center of the other of the long sides of the rectangular lens panel 13.

In this case, three position specifying devices 33 are arranged in total, but also in this case, the alignment is performed at the Fresnel lenses 13f which are distanced from each other as much as possible, and thus, accuracy of the alignment can be increased.

In the above embodiment, a case has been shown in which: each position specifying device 33 includes four laser beam source parts 40; and the respective four laser beam source parts 40 are configured to emit linear laser beams toward incident positions 42 respectively set at the four corners of the incident surface 13f1 of the Fresnel lens 13f. However, it is sufficient that each position specifying device 33 includes at least two laser beam source parts 40.

However, the incident positions 42 in this case need to be positions that allow the captured portions 51 of beam images of one pair of linear laser beams having passed one pair of incident positions 42 in the captured image 50, to be captured portions of beam images of linear laser beams that cross each other at the optical axis point S1. This is because if the captured portions 51 of beam images of one pair of linear laser beams having passed one pair of incident positions 42 in the captured image 50 cross each other at the optical axis point S1, the position of the optical axis S of the Fresnel lens 13f can be recognized.

Figure 10A:
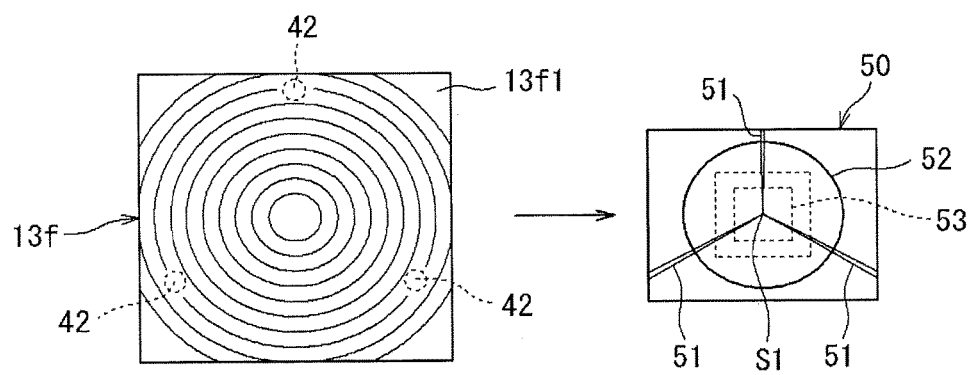
FIG. 10A shows another examples of incident positions set on the incident surface of a Fresnel lens.
Figure 10B:
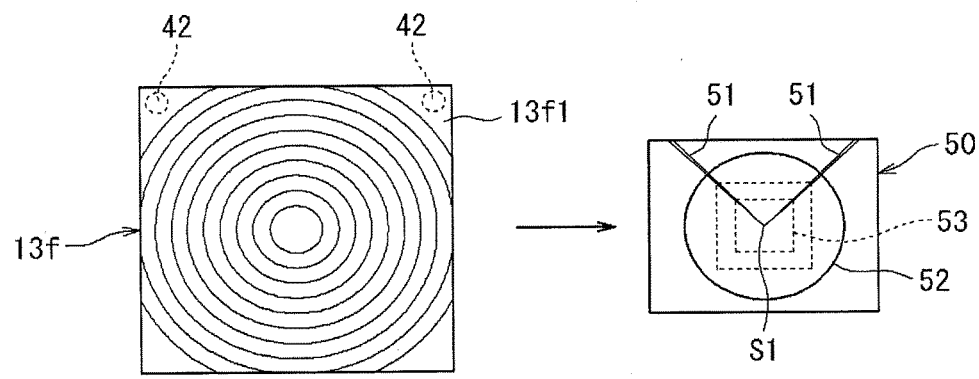
FIG. 10B shows the other examples of incident positions set on the incident surface of a Fresnel lens.

For example, FIG. 10B shows a case where the incident positions 42 are respectively set at one pair of corner portions among four corners of the incident surface 13f1 of the Fresnel lens 13f, the pair of corner portions satisfying the relationship of being both ends of the same side. In this case, the captured portion 51 of beam images of one pair of linear laser beams having passed one pair of incident positions 42 in the captured image 50 cross each other at the optical axis point S1.

When one pair of incident positions 42 are provided on a diagonal line that passes the optical axis S of the Fresnel lens 13f, the beam images of one pair of linear laser beams in this case overlap each other without crossing each other in the captured image 50, and appear as one linear image that passes the optical axis point S1. Thus, it becomes difficult to identify the optical axis point S1.

In contrast to this, as shown in FIG. 10B, when the incident positions 42 are respectively set at positions that allow the captured portions 51 of beam images of one pair of linear laser beams having passed one pair of incident positions 42 in the captured image 50, to be captured portions of beam images of linear laser beams that cross each other at the optical axis point S1, the position of the optical axis S of the Fresnel lens 13f can be assuredly recognized.

Alternatively, for example, as shown in FIG. 10A, three incident positions 42 may be set with a central angle of 120 degrees therebetween, about the optical axis point S1 of the Fresnel lens 13f. In this case, in the captured image 50, beam images of the respective three linear laser beams appear so as to cross one another.

In the above embodiment, the method for mounting the lens panel 13 regarding the module 1M which includes a large number of units 20 has been described. However, the mounting method can be applied to a photovoltaic apparatus composed of a single unit 20.

[5. Others]

In the above embodiment, an exemplary case has been shown in which: the operator of the mounting device 30 performs positional adjustment between the lens panel 13 (the Fresnel lenses 13f) and the corresponding power generating element parts 21 while confirming the captured images 50 displayed on the display section 37. However, for example, based on the captured images 50 respectively provided from the position specifying devices 33, the controller 35 may specify an optimum position, and provide the manipulator 32 with positional information indicating the specified position, thereby to control the manipulator 32.

In this case, the controller 35 generates positional information indicating the positional relationship, grasped by performing image processing on each captured image 50, between the power generating element part 21 and the beam images respectively formed by the linear laser beams having passed the Fresnel lens 13f to be concentrated toward the focal point F thereof.

The manipulator 32 performs positional adjustment between the lens panel 13 (the Fresnel lenses 13f) and the power generating element parts 21 based on the above positional information.

Thus, the controller 35 and the manipulator 32 form a positional adjustment section which performs positional adjustment between the lens panel 13 (the Fresnel lenses 13f) and the power generating element parts 21 based on the positional information indicating the positional relationship, grasped through each captured image 50, between the power generating element part 21 and the beam images respectively formed by the linear laser beams having passed the Fresnel lens 13f to be concentrated toward the focal point F.

In this case, the controller 35 may be configured by a computer including a CPU, a storage device, and the like. In that case, the function as the positional adjustment section is realized by a computer program. In the storage device, a computer program for realizing the function as the positional adjustment section is stored in addition to programs for controlling each section.

This computer program is a computer program for causing a computer to execute processes regarding production of a concentrator photovoltaic unit, the concentrator photovoltaic unit including a condenser lens configured to concentrate sunlight incident from an incident surface thereof, onto a power generating element part, the computer program causing the computer to execute: a step of causing a plurality of laser beam sources to emit linear laser beams in parallel to the optical axis of the condenser lens, respectively toward a plurality of specific positions previously set on the incident surface; and a positional adjustment step of performing positional adjustment between the condenser lens and the power generating element part, based on a captured image outputted by an image capturing section configured to capture an image of the power generating element part side along the optical axis from the incident surface side of the condenser lens, wherein the plurality of specific positions are set at positions that allow at least one pair of beam images to be beam images of linear laser beams that cross each other at the optical axis point of the condenser lens in the captured image.

Also in the mounting device 30 having the above configuration, alignment between the lens panel 13 (the Fresnel lens 131) and the power generating element part 21 can be easily and accurately performed.

[6. Conclusion]

The embodiment disclosed herein is to be considered in all respects as illustrative and not restrictive. The scope of the present invention is indicated by the appended claims rather than by the foregoing meaning, and all changes that come within the meaning and range of equivalency of the claims are therefore intended to be embraced therein.

REFERENCE SIGNS LIST 1 concentrator photovoltaic panel
1M concentrator photovoltaic module 2 post
3 base
11 housing
11a bottom surface
11c opening
12 flexible printed circuit
13 lens panel
13f Fresnel lens
13f1 incident surface
14 connector
15 wall part
15a end surface
16 flexible substrate
20 unit
21 power generating element part
22 resin frame
23 solar cell
24 ball lens
30 mounting device
31 base
31a upper surface
32 manipulator
32a arm part
32b suction cup part
32c operation controller
33 position specifying device
35 controller
36 operation section
37 display section
37a display screen
40 laser beam source part
40a emission portion
41 camera part
42 incident position
50 captured image
51 captured portion
51a captured portion of first beam image
51b captured portion of second beam image
51c captured portion of third beam image
51d captured portion of fourth beam image
52 captured portion of ball lens
53 captured portion of solar cell
100 concentrator photovoltaic apparatus
F focal point
S optical axis
S1 optical axis point

The invention claimed is:

1. A method for producing a concentrator photovoltaic unit, the concentrator photovoltaic unit including a condenser lens configured to concentrate sunlight incident from an incident surface thereof, onto a power generating element part, the method comprising:
a first step of fixing a plurality of laser beam sources to the condenser lens at a predetermined distance from the incident surface;
a second step of emitting linear laser beams in parallel to an optical axis of the condenser lens, respectively toward a plurality of specific positions previously set on the incident surface, the linear laser beams being emitted by the plurality of laser beam sources and forming irradiation spots on the plurality of specific positions, the plurality of specific positions being positions except for an optical axis point on the incident surface;
a third step of capturing an image of beams and the power generating element part, the image being captured through the condenser lens along the optical axis from the incident surface side of the condenser lens, the beams respectively formed by the linear laser beams having passed the condenser lens to be concentrated toward a focal point of the condenser lens;
a fourth step of performing positional adjustment between the condenser lens and the power generating element part, based on positional relationship, grasped through the captured image, between the power generating element part and linear beam images in the captured image; and
a fifth step of removing the plurality of laser beam sources, wherein
the plurality of specific positions in the first step are set to positions that allow at least one pair of linear beam images, among the linear beam images specified in the captured image, to be beam images of linear laser beams that cross each other at an optical axis point of the condenser lens, and
the positional adjustment in the third step is performed based on a positional relationship between the power generating element part and a cross point where the one pair of linear beam images cross in the captured image.

2. The method for producing the concentrator photovoltaic unit according to claim 1, wherein
the power generating element part includes a power generating element, and a secondary condenser lens configured to receive light concentrated by the condenser lens and to lead the light to the power generating element.

3. A method for producing a concentrator photovoltaic module, the concentrator photovoltaic module including: a plurality of power generating element parts provided in a form of an array; and a concentrating member in which a plurality of condenser lenses each concentrating sunlight incident from an incident surface thereof are formed at positions on optical axes thereof and corresponding to the power generating element parts, the method comprising:
a first step of fixing a plurality of laser beam sources to at least two condenser lenses among the plurality of condenser lenses at a predetermined distance from the incident surface of each of the at least two condenser lenses;
a second step of emitting linear laser beams in parallel to the optical axis of each of at least two of the condenser lenses, respectively toward a plurality of specific positions previously set on the incident surface, the linear laser beams being emitted by the plurality of laser beam sources and forming irradiation spots on the plurality of specific positions, the plurality of specific positions being positions except for an optical axis point on the incident surface;
a third step of capturing images of beams and the power generating element part corresponding thereto, the image being captured through the condenser lens along the optical axis from the incident surface side of at least two of the condenser lenses, the beams respectively formed by the linear laser beams having passed at least two of the condenser lenses to be concentrated toward a focal point of the condenser lenses;
a fourth step of performing positional adjustment between the concentrating member and the power generating element parts based on positional relationship, grasped through the captured images, between linear beam images in the captured images, and the power generating element part corresponding thereto; and
a fifth step of removing the plurality of laser beam sources, wherein the plurality of specific positions in each of the at least two of the condenser lenses in the first step are set to positions that allow at least one pair of linear beam images, among the linear beam images specified in the captured image, to be beam images of linear laser beams that cross each other at an optical axis point of the condenser lens, and the positional adjustment in the third step is performed based on a positional relationship between the power generating element part and a cross point where the one pair of linear beam images cross in the captured image.

4. The method for producing the concentrator photovoltaic module according to claim 3, wherein the first step is performed for each of four of the condenser lenses respectively positioned at four corners of the concentrating member having a quadrangular shape, or for each of four of the condenser lenses respectively positioned at edge portions at centers of respective sides of the concentrating member having a quadrangular shape, and positional adjustment between the concentrating member and the power generating element parts is performed through the third step.

5. A production apparatus for a concentrator photovoltaic unit, the concentrator photovoltaic unit including a condenser lens configured to concentrate sunlight incident from an incident surface thereof, onto a power generating element part, the production apparatus comprising:

a plurality of laser beam sources configured to emit linear laser beams in parallel to an optical axis of the condenser lens, respectively toward a plurality of specific positions previously set on the incident surface, the linear laser beams forming irradiation spots on the plurality of specific positions, the plurality of specific positions being positions except for an optical axis point on the incident surface, the linear laser beams being configured to perform positional adjustment between the condenser lens and the power generating element part;

an image capturing section configured to capture an image of beams and the power generating element part, and configured to output the captured image, the image being captured through the condenser lens along the optical axis from the incident surface side of the condenser lens, the beams respectively formed by the linear laser beams having passed the condenser lens to be concentrated toward a focal point of the condenser lens; and a positional adjustment section configured to perform positional adjustment between the condenser lens and the power generating element part based on positional relationship, grasped through the captured image, between the power generating element part and linear beam images in the captured image, wherein the plurality of specific positions are set to positions that allow at least one pair of linear beam images, among the linear beam images specified in the captured image, to be beam images of linear laser beams that cross each other at an optical axis point of the condenser lens in the captured image, and the positional adjustment section is configured to perform positional adjustment based on a positional relationship between the power generating element part and a cross point where the one pair of linear beam images cross in the captured image.

6. A production apparatus for a concentrator photovoltaic module, the concentrator photovoltaic module including: a plurality of power generating element parts provided in a form of an array; and a concentrating member in which a plurality of condenser lenses each concentrating sunlight incident from an incident surface thereof are formed at positions on optical axes thereof and corresponding to the power generating element parts, the production apparatus comprising:

a plurality of laser beam sources configured to emit linear laser beams in parallel to the optical axis of each of at least two of the condenser lenses, respectively toward a plurality of specific positions previously set on the incident surface of the condenser lens, the linear laser beams forming irradiation spots on the plurality of specific positions, the plurality of specific positions being positions except for an optical axis point on the incident surface, the linear laser beams being configured to perform positional adjustment between the condenser lenses and the power generating element parts;

image capturing sections respectively provided at the at least two of the condenser lenses, each image capturing section configured to capture, through the condenser lens along the optical axis from the incident surface side of the condenser lens, an image of beams and the power generating element part corresponding thereto, and configured to output the captured image, the beams respectively formed by the linear laser beams having passed the condenser lens to be concentrated toward a focal point of the condenser lens; and a positional adjustment section configured to perform positional adjustment between the concentrating member and the power generating element parts based on positional relationship, grasped through the captured image from each image capturing section, between linear beam images in the captured image, and the power generating element part corresponding thereto, wherein the plurality of specific positions are set to positions that allow at least one pair of linear beam images, among the linear beam images specified in the captured image, to be beam images of linear laser beams that cross each other at an optical axis point of the condenser lens in the captured image, and the positional adjustment section is configured to perform positional adjustment based on a positional relationship between the power generating element part and a cross point where the one pair of linear beam images cross in the captured image.

* * * * *